(12) United States Patent
Koppell et al.

(10) Patent No.: US 12,033,829 B2
(45) Date of Patent: Jul. 9, 2024

(54) OPTICALLY-ADDRESSED PHASE MODULATOR FOR ELECTRON BEAMS

(71) Applicant: The Board of Trustees of the Leland Stanford Junior University, Stanford, CA (US)

(72) Inventors: Stewart A. Koppell, San Mateo, CA (US); Adam Bowman, Stanford, CA (US); Mark A. Kasevich, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 395 days.

(21) Appl. No.: 17/613,181

(22) PCT Filed: May 28, 2020

(86) PCT No.: PCT/US2020/034875
§ 371 (c)(1),
(2) Date: Nov. 22, 2021

(87) PCT Pub. No.: WO2020/243268
PCT Pub. Date: Dec. 3, 2020

(65) Prior Publication Data
US 2022/0238298 A1 Jul. 28, 2022

Related U.S. Application Data

(60) Provisional application No. 62/853,462, filed on May 28, 2019.

(51) Int. Cl.
*H01J 37/153* (2006.01)
*H01J 37/26* (2006.01)

(52) U.S. Cl.
CPC ............. *H01J 37/153* (2013.01); *H01J 37/26* (2013.01); *H01J 2237/2441* (2013.01); *H01J 2237/2614* (2013.01)

(58) Field of Classification Search
CPC .. H01J 37/153; H01J 37/26; H01J 2237/2441; H01J 2237/2614
See application file for complete search history.

(56) References Cited

U.S. PATENT DOCUMENTS

| | | | |
|---|---|---|---|
| 7,741,620 B2 | 6/2010 | Doering | |
| 8,791,416 B2 | 7/2014 | Shiue | |
| 9,006,652 B2 | 4/2015 | Buijsse | |
| 2015/0060666 A1 | 3/2015 | Hatakeyama | |
| 2018/0254167 A1 | 9/2018 | Zhao | |
| 2018/0286631 A1 | 10/2018 | Axelrod | |

*Primary Examiner* — Nicole M Ippolito
*Assistant Examiner* — Hanway Chang
(74) *Attorney, Agent, or Firm* — LUMEN PATENT FIRM

(57) ABSTRACT

An electron beam phase plate is provided where patterned radiation is provided to the phase plate to creates a corresponding electrical pattern, This electrical pattern provides a corresponding patterned modulation of the electron beam. Such modulation can be done in transmission or in reflection. This approach has numerous applications in electron microscopy, such as providing phase and/or amplitude shaping, aberration correction and providing phase contrast.

15 Claims, 7 Drawing Sheets

OPTICALLY-ADDRESSED PHASE MODULATOR FOR ELECTRON BEAMS

FIELD OF THE INVENTION

This invention related to phase modulation of electron beams.

BACKGROUND

A programmable phase plate (PPP) would allow control of the shape—in particular the transverse phase and amplitude distribution—of an electron beam. This would address several challenges in electron microscopy: it could reduce the cost of aberration-correction, allow more efficient measurements of dose-sensitive materials, enable new imaging techniques based on novel beam shapes, and solve the long-standing problem of implementing a practical $\pi/2$ phase plate for phase contrast electron microscopy.

Few designs for a practical PPP have been published. The most promising recent work is by Veerbeck et al., who recently demonstrated a nano-fabricated 2×2 array of Einzel lenses as a proof of concept for a larger scale device (which would have a few tens of pixels). However this approach has significant disadvantages. E.g., it would be difficult to bring losses below 50%—the loss for the Veerbeck proof of concept is 88%. Furthermore, an Einzel lens array with hundreds of independently adjustable elements would require intricate and delicate circuitry directly in the electron beam path.

SUMMARY

In this work, an improved programmable phase plate for electron beams is provided. In one example, the basic idea is to form a planar semiconductor photodiode (e.g., a p-n junction or a Schottky barrier) and illuminate the photodiode with a suitably patterned optical beam. The resulting spatial variation in electric potential in the photodiode leads to a corresponding phase variation in an electron beam that passes through (or is reflected from) the photodiode.

The laser-controlled PPP can be a thin-film Schottky or PN diode, which can be supported by a Silicon Nitride membrane (suitable Silicon Nitride membranes are commercially available. They are often used as sample holders in electron microscopes). The diode is made from a thin (~10 nm) layer of doped semiconductor and one or more thin (~5 nm) layers of metal. The entire device can be less than 20 nm thick, making it virtually transparent to electron beams. Diffusion of free carriers from the semiconductor into the metal establishes a built-in voltage difference between the diode layers. When illuminated by a laser, electron-hole pairs are produced in the semiconductor and separated by the built-in voltage, forward-biasing the junction and causing an open-circuit photo-voltage. The local photo-voltage is controllable with the local intensity of the laser. A spatial light modulator (SLM) or digital micro-mirror device (DMD) can be used to pattern the intensity of the laser, which in turn controls the pattern of photo-voltage on the phase plate. As electrons pass through the PPP, their phase is affected by the local voltage. As a result, the exiting electron beam's wave front is controllable. The device could also be used as a mirror, controlling the shape of reflected beams. A 500 micron by 500 micron PPP could have close to a million controllable pixels, and would require very little laser power (~1 mW) to operate.

Significant advantages are provided. Such a laser-controlled electron phase modulator would be cheap, scalable, and durable compared to conventional approaches that require elaborate nano-fabrication. The optical pattern could be changed on nanosecond time scales, allowing fast adaptive imaging and potentially 3d shaping of the electron beam. Low loss (e.g., a few percent) is provided, because a laser-controlled device could be made extremely thin—less than 20 nm.

Applications include, but are not limited to: inexpensive aberration correction, providing efficient measurements of dose-sensitive samples, providing a $\pi/2$ electron phase plate, beam shaping, non-linear electron optics and providing a fast binary blanker. These application will be considered in turn.

Inexpensive aberration-correction: While the resolution of light microscopes is generally limited by diffraction, the resolution of electron microscopes is generally limited by lens aberrations. The highest-resolution electron microscopes are equipped with multi-pole aberration-correcting lenses, which significantly increase the cost and complexity of the machine. A PPP could potentially correct higher order aberrations, would be easier to operate, and would be significantly less expensive.

Efficient measurements of dose-sensitive samples: Many samples of great practical interest (like proteins, polymers, and batteries) are destroyed by damage from the electron beam before they can be imaged. In these cases, resolution is dose-limited rather than aberration-limited.

By adaptively adjusting the phase and amplitude of the incident beam, it is possible to reduce the required dose for imaging. In a paper proposing a programmable electrostatic mirror in 2010, Okamoto calculated that adaptively adjusting the electron phase could reduce sample damage by a factor of 10.

$\pi/2$ phase plate: The standard method of creating image contrast in electron microscopes (defocus) is inefficient—a lot of information available in the beam is unusable. Zernike and Volta phase plates are the most practical modern implementations of efficient contrast generation, but the former is difficult to align and the latter is unstable. There is still no solution simple enough to encourage wide-spread adoption. A laser-controlled PPP would be stable and simple to align.

Beam Shaping: There has been recent interest in the applications of exotic electron beam shapes in electron microscopy. Theoretical work has identified various advantages of using, for example, orbital angular momentum states, beam splitters, and Bessel beams. Many useful beam shapes are difficult or currently infeasible to generate. When they can be made, it generally requires hardware specific to the beam shape. A system of two PPPs could generate many beam shapes.

Non-Linear Electron Optics: The electron beam itself can generate an electrostatic potential in the photodiode. As a result, the PPP will cause a phase shift in the electron beam in areas of high beam intensity. This allows for self-focusing effects and various phase contrast applications without the need for an optical programming beam.

Fast binary blanker: A single pixel camera captures images using a bucket detector and a programmable binary mask. A single pixel electron microscope (SPEM) could be built using a PPP and a digital micro-mirror device (DMD) to implement a binary blanker. A SPEM would use a far less expensive detector and potentially simpler optics than a standard microscope and could also use compressive sensing algorithms to dramatically increase the efficiency of the exposures (making it possible to image more delicate samples and decreasing acquisition time).

DETAILED DESCRIPTION

Section A describes general principles relating to embodiments of the invention. Section B is detailed consideration of an exemplary embodiment. Section C describes several variations of the basic idea.

A) General Principles

Figure 1:
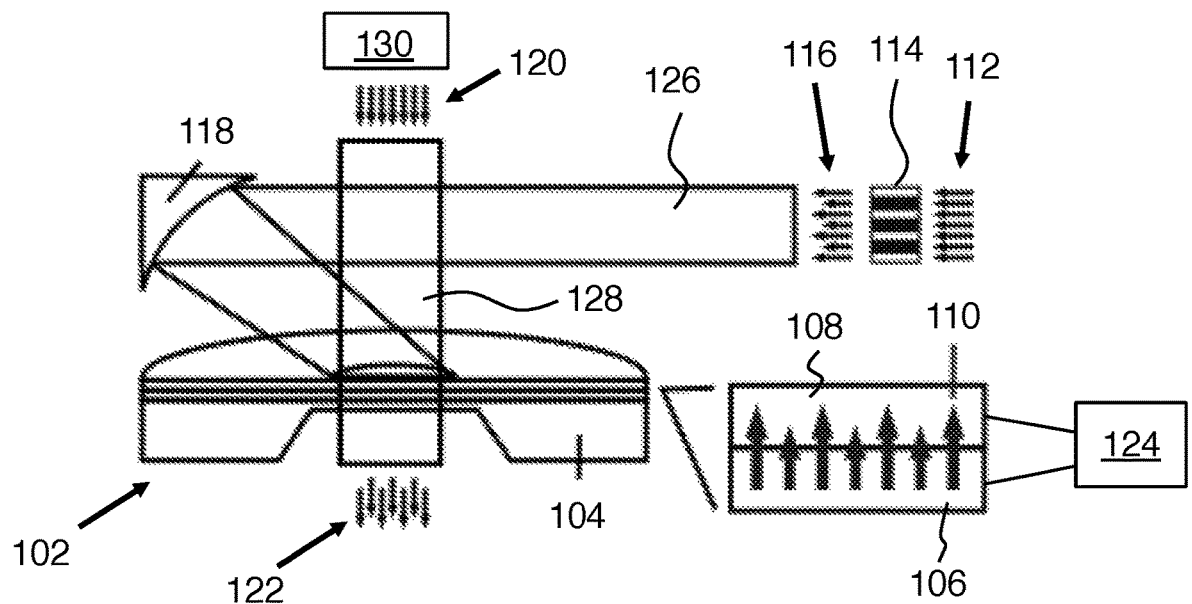
FIG. 1 shows a first embodiment of the invention.

FIG. 1 shows a first embodiment of the invention. This example is an apparatus for providing patterned phase modulation of an electron beam. This apparatus includes a planar radiation-sensitive device 102 configured to interact with an electron beam 128, a radiation source (112 and 114) configured to provide a pattern of incident radiation 116 to planar radiation-sensitive device 102, and electron optics 130 configured to provide an input electron beam 128 to the planar radiation-sensitive device 102. Here the planar radiation-sensitive device 102 provides a pattern of electric potential 110 in response to the pattern of incident radiation 116. Interaction of the planar radiation-sensitive device 102 with the electron beam 128 provides a patterned phase modulation 122 of the electron beam corresponding to the pattern of electric potential. Here 120 schematically shows uniform input phase (i.e., arrows all lined up). It will be convenient to refer to this apparatus briefly as a programmable phase plate (PPP).

Further details of this example are as follows. Planar radiation-sensitive device 102 includes an optional support layer 104 (of silicon nitride in this example), and the physical effect providing the radiation sensitivity is the photovoltaic effect in a semiconductor-metal junction. Here 106 and 108 are semiconductor and metal, respectively. A laser source 112 is modulated with a spatial light modulator 114 (or a deformable mirror device) to provide the pattern of incident radiation 116. Optical beam 126 is focused onto planar radiation-sensitive device 102 with a focusing mirror 118.

Optionally, a voltage source 124 is included to provide an electrical bias to planar radiation-sensitive device 102. This electrical bias can be pulsed or time-independent. In cases where the electrical bias is pulsed, it is preferred for the pulsing of the electrical bias to be synchronous with the incident radiation. For example, if the planar radiation-sensitive device is a photodiode, the pulsed electrical bias preferably reverse biases the photodiode synchronously with the pattern of incident radiation. As seen in section B5, this can improve the response speed.

Although this example relates to the photovoltaic effect in a photodiode, any device capable of providing an electrical response to incident radiation can be employed, including but not limited to: photoelectric devices, photothermal devices, pyroelectric devices, photodissociation devices, photovoltaic devices, photochemical devices and plasmonic devices. Photovoltaic devices can be PN diodes, PIN diodes or Schottky diodes.

In this example, the pattern of incident radiation is a pattern of incident light. As seen in section C, the pattern of incident radiation can also be a particle beam. Thus 'radiation' here is intended to include both electromagnetic radiation and particle beam radiation.

In this example the planar radiation-sensitive device interacts with the electron beam by transmission of the electron beam through the planar radiation-sensitive device.

Figure 2:
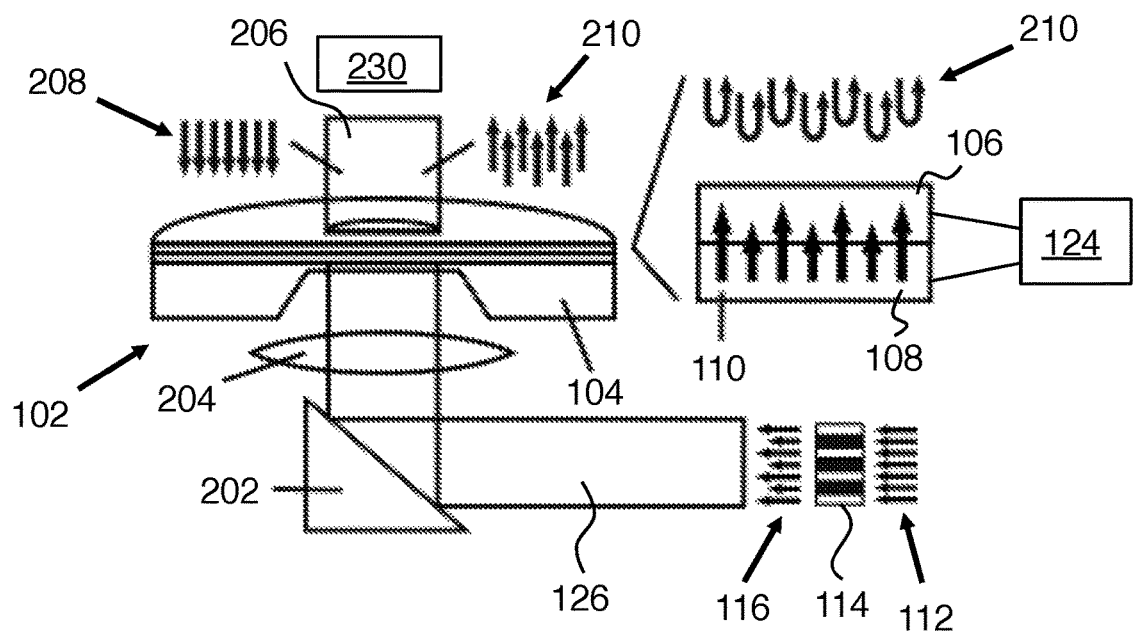
FIG. 2 shows a second embodiment of the invention.

FIG. 2 shows a second embodiment of the invention where the electron beam is reflected from the planar radiation-sensitive device. The differences relative to FIG. 1 are as follows. Optical beam 126 is provided to planar radiation-sensitive device 102 with a mirror 202 and focusing lens 204. Electron optics 230 is configured to separate an output electron beam having phase modulation 210 from an input electron beam as they travel in opposite directions on common beam line 206. Here the phase modulation of output electron beam 210 is schematically shown by staggered arrows compared to the uniform arrows 208 relating to the input electron beam.

Figure 3:
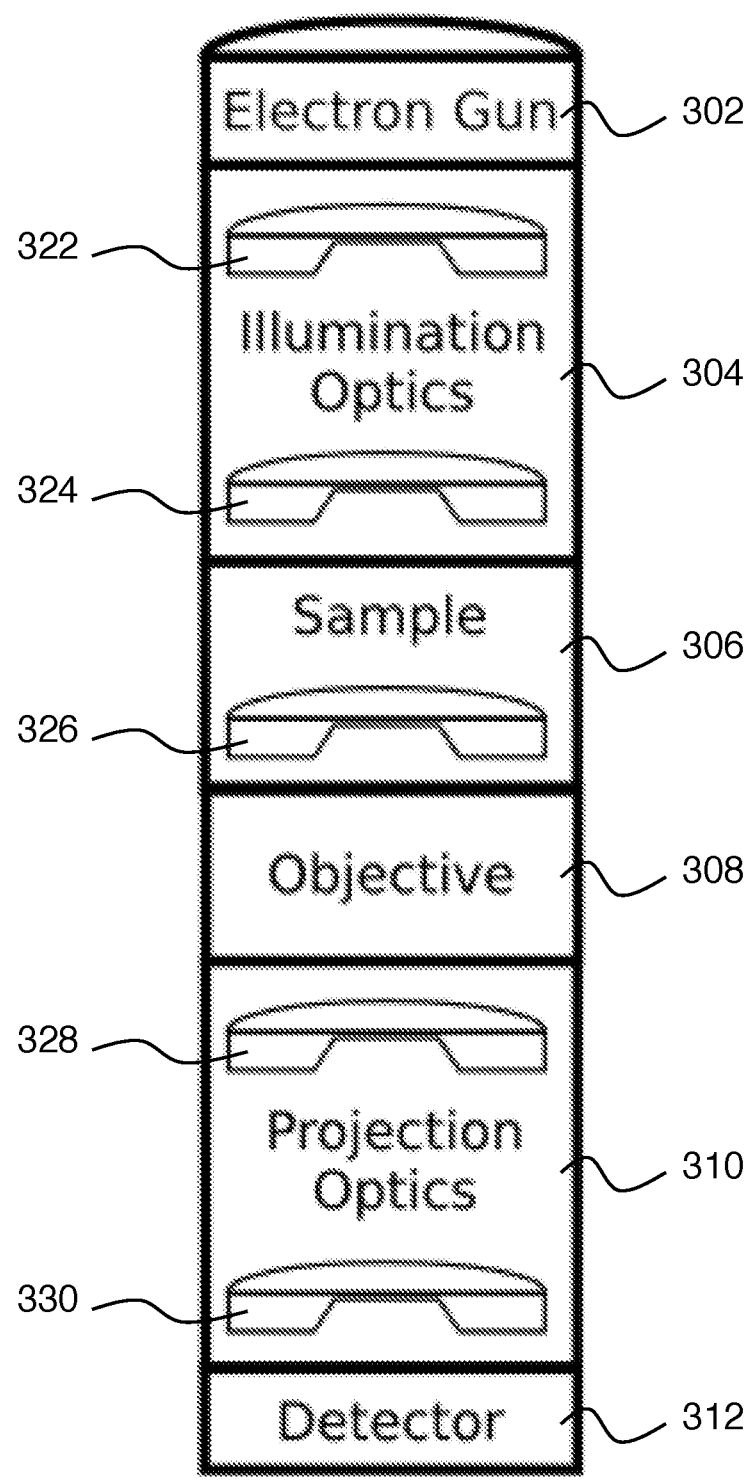
FIG. 3 shows how PPPs can be used in a transmission electron microscope.

FIG. 3 shows how PPPs as described above can be used in a transmission electron microscope. Here 302 is the electron gun, 304 is the illumination optics, 306 is the sample holder, 308 is the objective lens, 310 is the projection optics and 312 is the detector. Transmissive PPP 322 can provide phase shaping, transmissive PPP 324 can provide amplitude shaping, transmissive PPP 326 can provide phase shaping incorporated with the sample holder, transmissive PPP 328 can provide aberration correction, and transmissive PPP 330 can provide phase contrast. In practice, an electron microscope can include some or all of 322, 324, 326, 328, 330 in any combination.

Figure 4:
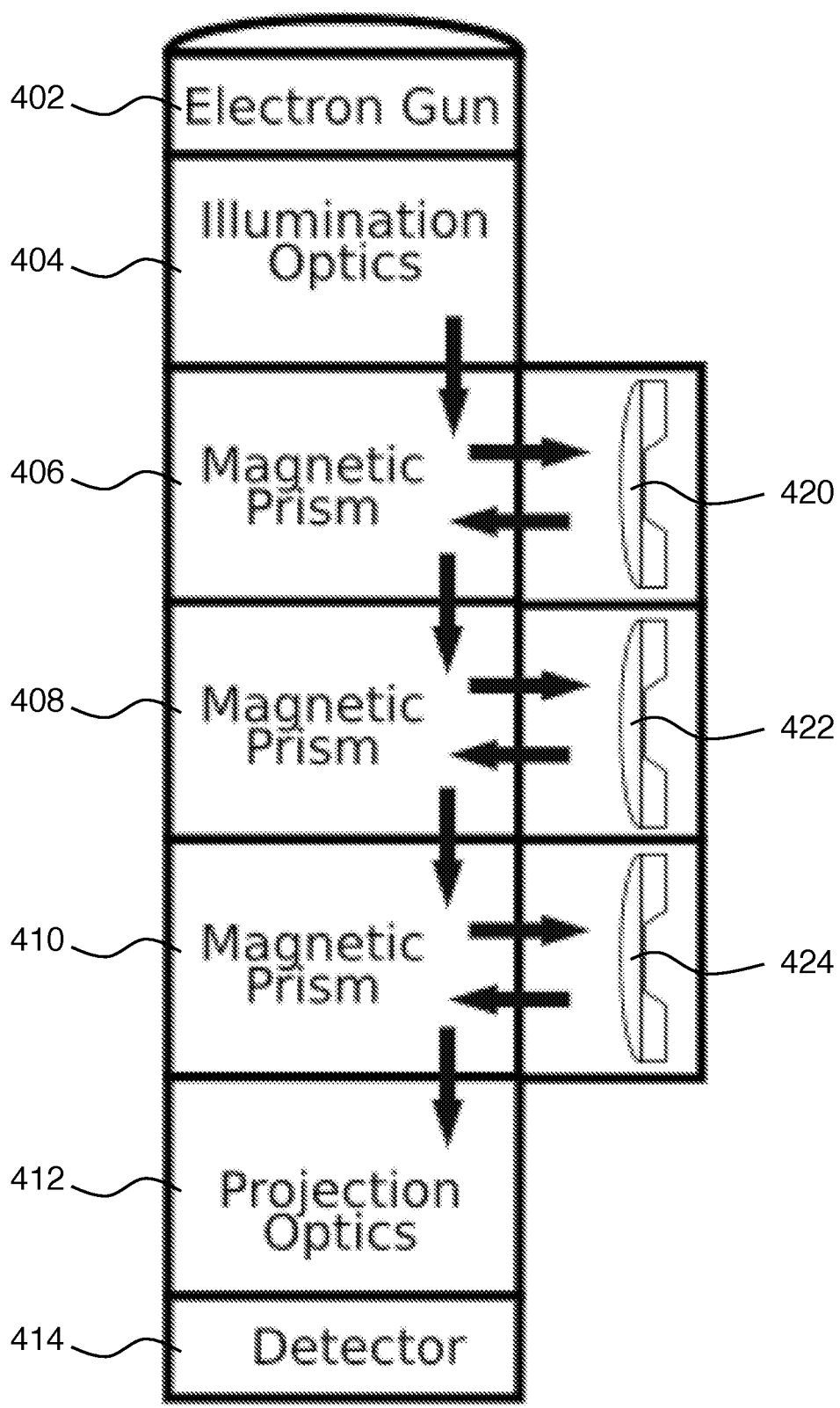
FIG. 4 shows how PPPs can be used in a reflective electron microscope.

FIG. 4 shows how PPPs as described above can be used in a reflective electron microscope (e.g., a low energy electron microscope (LEEM)). Here 402 is the electron gun, 404 is the illumination optics, 406 is a first magnetic prism, 408 is a second magnetic prism, 410 is a third magnetic prism, 412 is the projection optics, and 414 is the detector. Reflective PPP 420 can provide beam shaping, reflective PPP 422 can provide phase shaping incorporated with the sample holder, and reflective PPP 424 can provide aberration correction and phase contrast. In practice, an electron microscope can include some or all of 420, 422, 424 in any combination.

Thus an electron microscope can include one or more electron beam phase modulators, where the electron beam phase modulators are PPPs as described above. Such electron beam phase modulators can provide various functions, including but not limited to: amplitude shaping, phase shaping, aberration correction, and phase contrast.

B) Example

B1) Principle of Operation

The laser-controlled PPP of this example is a thin membrane with at least two layers forming a Schottky or PN junction and possibly another for mechanical support. When illuminated with a laser, a steady-state photovoltage is established across the junction. The local intensity of the laser determines the local photovoltage. If the intensity profile of the laser is patterned using a spatial light modulator (SLM), a related voltage pattern will be projected on the membrane. The PPP can be transmissive (the electron beam passes through the membrane) or reflective (the electrons bounce off of an equipotential just above the membrane). In either case, the voltage pattern on the membrane causes a spatially-varying phase shift in the electron beam. Depending on the application, the phase variation can be converted to amplitude variation using an electron lens. A system of two PPPs could control both the phase and amplitude of an electron beam, completely determining the transverse electron wavefunction. A transmissive PPP could be added to a transmission electron microscope (TEM) in the illumination optics (for beam shaping) and the projection optics (for phase contrast and aberration correction). A reflective PPP could replace a standard electron mirror in a low energy electron microscope (LEEM).

B2) Simulations

In order to calculate the effect of a static charge distribution on a reflected electron wavefront, we used a 2D finite element scheme to find the potential near the mirror, then estimated the change in a 2D wavefront using a 1D WKB approximation for each point on the wavefront. The phase shift as a function of the transverse coordinate is $$\Delta\phi(y) = \frac{2}{\hbar}\int_0^{z_t} \sqrt{2m(E - V(y, z))}\, dz$$

where $z_t$ is the turning point and $z=0$ is far from the mirror (>15 microns). Beyond 15 microns from the mirror, V becomes a function of z only and the relative phase shifts get frozen-in. The boundary conditions are wrapped in the transverse direction (for the y coordinate). Some results are shown in FIGS. 5A-6B.

Figure 5A:
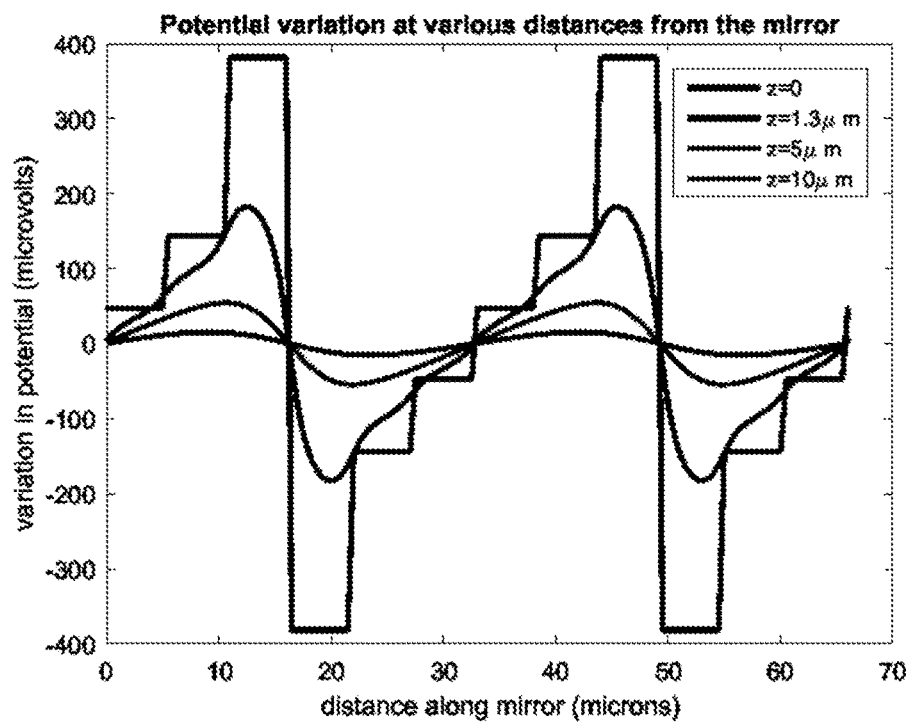
FIG. 5A shows electric potential at various distances from a reflective PPP vs. distance along the mirror.
Figure 5B:
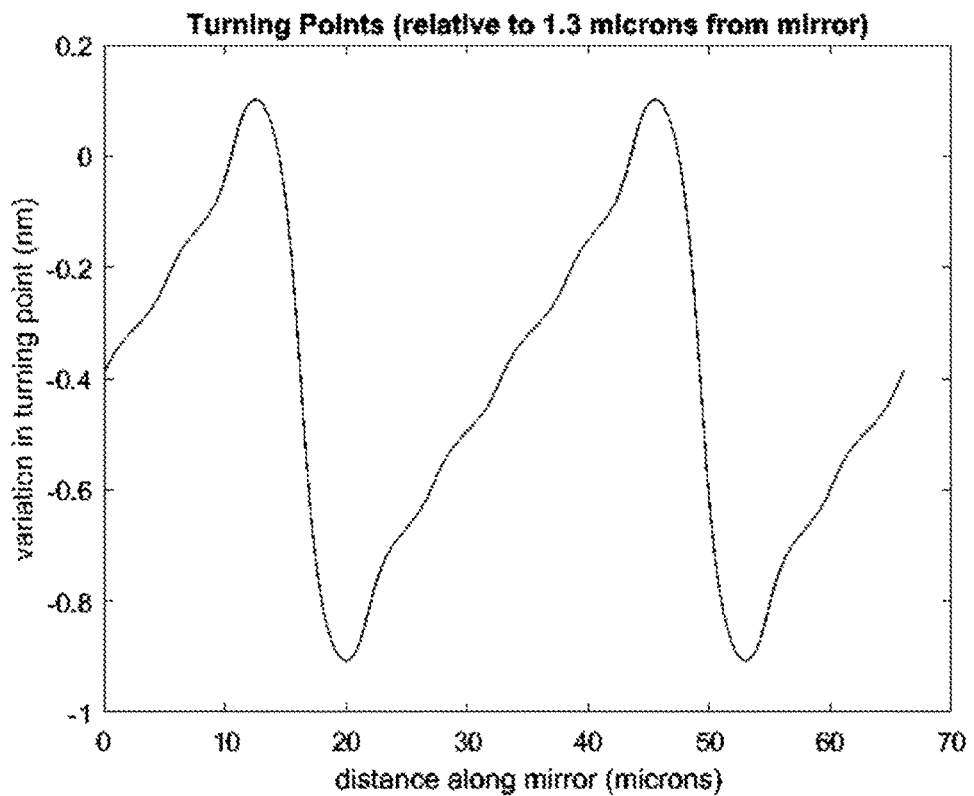
FIG. 5B shows electron turning point position vs. distance along the mirror for the example of FIG. 5A.

FIG. 5A shows transverse variation in potential at various distances form the mirror. The beam sees these variations superimposed on a ramp potential from a 2 kV/cm electric field. FIG. 5B shows variation in the turning point relative to an average of 1.3 microns. The wavelength of the electron at the turning point is larger than 100 nm, so the phase shift has little to do with these sub-nm variations. The phase shifts are also insensitive to the average turning point—a shift by 0.1 microns makes little difference (this corresponds to a stability of 102V of the mirror's potential relative to the gun potential).

Figure 6A:
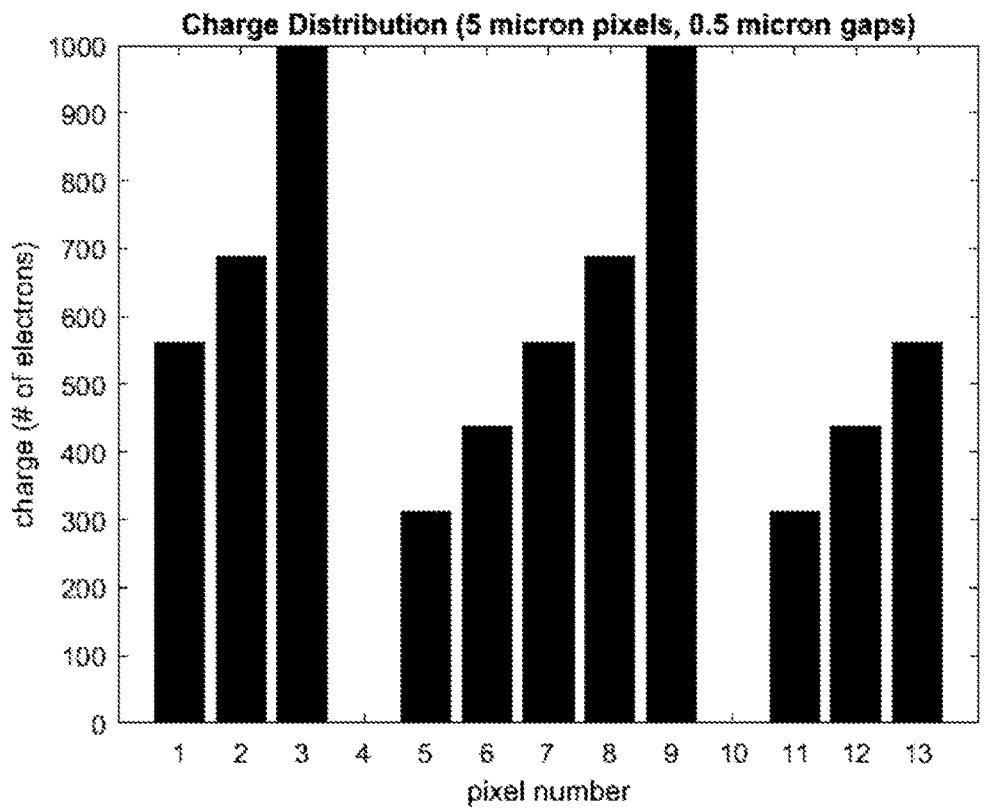
FIG. 6A shows an exemplary charge distribution suitable for creating a linear phase ramp.
Figure 6B:
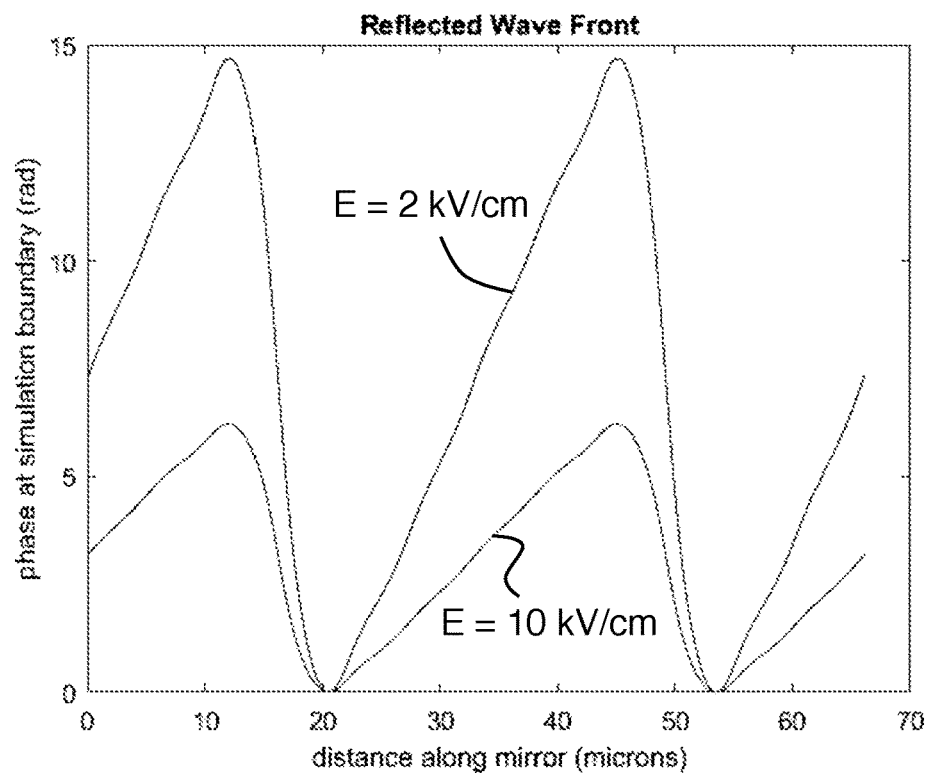
FIG. 6B shows simulated phase ramps corresponding to the example of FIG. 6A.

FIG. 6A shows an exemplary charge distribution suitable for creating a linear phase ramp. FIG. 6B shows simulated phase ramps corresponding to the example of FIG. 6A. More specifically, FIGS. 6A-B relate to 5 micron pixels with $10^{19}$ cm$^{-3}$ doping that have a capacitance of 2.5 femtoFarads: 1 microvolt per electron. With a 2 kV/cm electric field near the turning point, it takes 500 electrons for a particular pixel to induce a $2\pi$ phase shift. Notice that the charge distribution doesn't linearly translate to the wavefront shape. To make a sawtooth wavefront, pixels 3, 4, 9, and 10 had to be over-corrected.

In order to control the phase shifts of each pixel in a reflective PPP in increments much smaller than $2\pi$, these simulations show we need to have μV control of the pixel voltage (0.1 mV control is needed for a transmissive PPP). In addition, we want to use as many electrons as possible per radian of phase shift to reduce the effect of the charging current shot noise. That means fitting a lot of capacitance into a tiny area (for reference: if we just deposit static charge on the surface of an insulator, the voltage change per electron in a 5 micron region is about 300 μV).

For a reflective PPP, the magnitude of the electric field near the surface affects the sensitivity of the wavefront to the pixel voltages. In the tables below, we quantify this effect for the blaze pattern used in FIGS. 5A-6B. For several values of electric field magnitude, we calculated the sensitivity: $2\pi$ divided by the number of electrons needed to produce a $2\pi$ phase shift. Ideally, the sensitivity should be as small as possible to minimize the shot noise in the surface charge.

TABLE 1

Reflective PPP phase shift (mrad) per μV for various pixel sizes and electric fields.

|          | 5 μm | 3 μm | 1 μm |
|----------|------|------|------|
| 5 kV/cm  | 10   | 7.8  | 4    |
| 10 kV/cm | 7.5  | 5.6  | 2.9  |
| 15 kV/cm | 6.1  | 4.6  | 2.4  |

TABLE 2

Reflective PPP phase shift (mrad) per electron for various pixel sizes and electric fields, assuming a capacitance of 9fF/μm$^2$ (corresponding to a 10 nm Si depletion layer).

|          | 5 μm | 3 μm | 1 μm |
|----------|------|------|------|
| 5 kV/cm  | 7    | 16   | 72   |
| 10 kV/cm | 5    | 11   | 52   |
| 15 kV/cm | 4    | 9    | 43   |

The performance of a transmissive PPP can be simulated in a similar way: the phase shift is proportional to the integral of the electric potential calculated from a 2D finite element solver. The thickness of the device isn't important for this calculation—most of the phase shift accumulates in the free space nearby. The PPP can be one-sided (p-n) or two-sided (p-n-p). The tables below show the phase shifts caused by a one-sided transmissive PPP.

TABLE 3

Transmissive PPP phase shift (mrad) per mV for various pixel sizes and beam energies.

|          | 5 μm | 3 μm | 1 μm |
|----------|------|------|------|
| 50 keV   | 18   | 15   | 9    |
| 100 keV  | 14   | 11   | 6    |
| 300 keV* | 9.7  | 7.8  | 4.3  |

*Note: 300 keV is above the damage threshold of silicon.

TABLE 4

Transmissive PPP phase shift (µrad) per electron
for various pixel sizes and beam energies,
assuming a capacitance of 9fF/µm²
(corresponding to a 10 nm Si depletion layer).

|          | 5 µm | 3 µm | 1 µm |
|----------|------|------|------|
| 50 keV   | 13   | 30   | 163  |
| 100 keV  | 10   | 22   | 108  |
| 300 keV* | 7    | 16   | 78   |

*Note: 300 keV is above the damage threshold of silicon.

B3) Programming Convolution

In the previous section we calculated the relation between the phase shift induced in the electron beam and the voltage on the phase plate using a 2D finite element solver. For a megapixel PPP in 3D, this method would be prohibitively time consuming, especially when solving the inverse problem of determining the correct 2D voltage profile to obtain a particular 2D phase distribution. Luckily, we can do this calculation directly using the convolution theorem. Let's define $$A = \frac{q\sqrt{2m}}{2\sqrt{E}\hbar}$$

For example, if $E=10^5$ eV, $A=5.11$ radians per Volt micron. The relation between $\Delta\varphi$ and the phase plate voltage $V_p$ is $$\Delta\phi(\vec{r}) = A\mathcal{F}^{-1}\left\{\frac{1}{|\vec{q}|}\mathcal{F}(V_p)(\vec{q})\right\}$$

$$V_p(\vec{r}) = A^{-1}\mathcal{F}^{-1}\{|\vec{q}|\mathcal{F}(\Delta\phi)(\vec{q})\}$$

So the voltage required to create a phase feature is inversely proportional to the size of the feature. A feature of size ~5 microns with voltage $V_p=0.1V$ would have a phase shift of 2.55 radians (for $E=10^5$ eV). To get a $2\pi$ phase shift we'd need 0.25V. If the photocurrent in the junction is equal to the saturation current, the phase shift on a 5 micron pixel is 0.66 radians.

B4) Steady State Operation

We can model the steady state current in the device as the sum of three current distributions in the xy plane: the two-dimensional sheet current, the photocurrent, and the junction current. As photons cause electron-hole pairs to separate in the depletion layer, photocurrent will forward-bias the junction. In steady-state operation, an equal current will flow in the opposite direction. By combining Ohm's Law, the diode current-voltage equation, and conservation of charge, we can write a dimensionless differential equation $$\vec{\nabla}^2 J\left(1 + \frac{J_t}{J+1}\right) - |\vec{\nabla}J|^2 \frac{J_t}{(J+1)^2} + J = J_y$$

where the junction current J, the photocurrent $J_y$, and the thermal current $J_t$, are written in units of the saturation current, $J_0$. The thermal current is defined by $$J_t = nv_t\sigma/t$$

where n is the ideality constant, $v_t$ is the thermal voltage, σ is the conductivity, and t is the silicon thickness. We have not found an analytical solution to this equation, but we can glean a critical performance parameter: the transition length in response to a step function. Suppose $J_y=0$ for $x<0$ and $J_y=J_1$ for $x>0$. At its inflection point, the second derivative of J will be zero.

This condition lets us estimate the characteristic transition length $$\Delta_0 \equiv \frac{J}{|\vec{\nabla}J|} = \frac{J}{J+1}\sqrt{\frac{J_t}{J}}.$$

For example, if $J=1$ (still in units of $J_0$), then the transition length is $180t=1.5$ microns.

Doping and Thickness: In order to keep the sheet resistance R high, we will keep the doped layer thinner than the equilibrium length of the depletion layer. Devoid of excess carriers, the layer will have intrinsic resistivity (or larger, if surface recombination is important). A thinner doped layer also means more capacitance, which means less shot noise. Suppose we use 10 nm for the doped layer thickness. In that case, we want $I_0$ to be larger than $\Delta V/R=600$ fA and 3 fA for transmissive and reflective PPPs, respectively. The saturation current (due to thermionic emission) is $$J_0 = A^* T^2 e^{-\phi_B/kT}$$

where $A^*$ is the Richardson constant and $\phi_B$ is the built-in potential. For 5 micron pixels, $\phi_B=0.67V$ gives 10 pA saturation current—sufficient for the transmissive PPP. $\phi_B=0.81$ volts gives 50 fA saturation current—sufficiently large for the reflective PPP. The doping required to achieve a particular $\phi_B$ is $$N = \frac{\epsilon_s \phi_B}{q(t_s^2/2 + t_s t_i)}$$

where $t_s$ and $t_i$ are the thicknesses of the silicon and insulator (oxide) films, respectively, and $\epsilon_s$ is the permittivity of silicon. For a 10 nm silicon layer and 2 nm oxide layer, $N=6\times10^{-18}$ gives $\phi_B=0.67V$ while $N=5.8\times10^{-18}$ gives $\phi_B=0.81V$ Laser Power: If we use a 500 nm laser, the reflectivity of silicon is ~0.4 and the absorptivity is ~$10^4$/cm. Producing 600 fA of photocurrent would require 0.1 nW of optical power. Producing 3 fA of photocurrent would require 1 pW of optical power.

B5) Pulsed Operation

The switching rate for a PPP in operating with steady state illumination is only about 10 Hz due to the large capacitance of the structure. In order to switch faster, the device can be operated with pulsed illumination:
1. Quickly resetting the device: a fast (ns) low voltage pulse (~1V) is applied to the PPP to cause reverse bias to the point of breakdown. An exponential current will flow across the junction, equalizing the voltage across the device.
2. A fast (ns), low powered optical pulse quickly charges the pixels 3. Current from the pixels leaks across the junction and, far more quickly, between the pixels. The result is a 'droop' in the phase mask values. The device should be reset and reprogrammed before the droop becomes significant—at a rate of about 1 kHz. With ns programming time, the device would have a duty cycle of $1-10^{-6}$, so it could operate with a continuous electron beam current.

The pulsed operation mode will have two important advantages to the steady state mode besides the fast switching:

1. The PPP will support much larger voltages with much less photocurrent current in reverse bias.
2. In pulsed mode there is a linear relation between the input optical power and the resulting voltage. In steady state mode the relation is extremely non-linear, so accurate programming over large voltage ranges would require a large bit depth.

C) Variations

Figure 7:
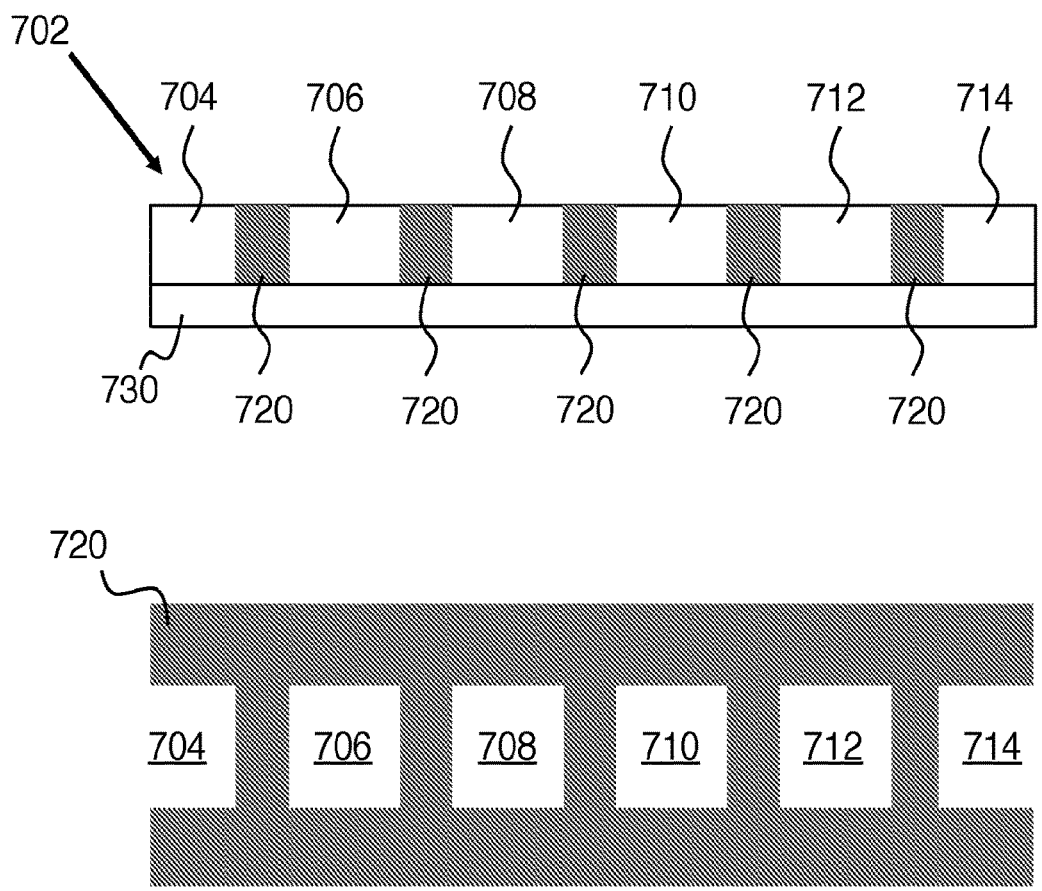
FIG. 7 shows an example of a PPP having a pixelation pattern.

FIG. 7 shows an example of a PPP having a pixelation pattern. The top of the figure is a side view and the bottom is a roughly corresponding top view. Here 730 is a conductive layer (metal or highly doped semiconductor) to provide a uniform potential, and planar radiation-sensitive device 702 includes a passive pixelation pattern 720 separating pixels 704, 706, 708, 710, 712, 714, which can reduce lateral crosstalk in the pattern of electric potential. These pixels are doped to form junctions with conductive layer 730. Pattern 720 can be formed by resistive barrier regions of the device, thereby inhibiting current flow from one pixel to the next. For ease of illustration only a single row of pixels is shown, but in practice large 2D arrays of pixels would usually be used.

Figure 8:
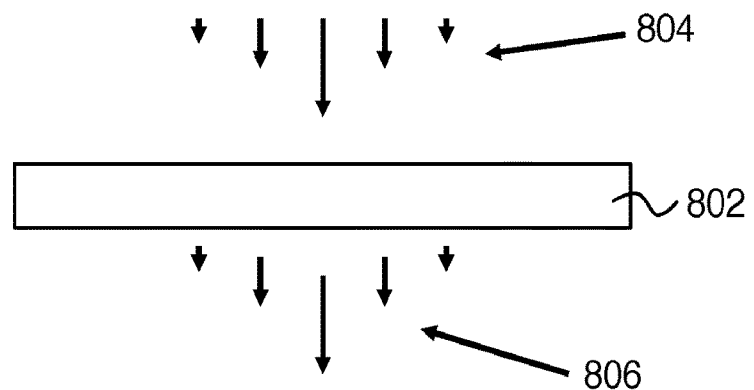
FIG. 8 schematically shows an example of electron beam self-phase modulation in a PPP.

In the preceding examples, the radiation used to pattern the PPP was light. Other kinds of radiation can also be used to do this, such as particle beams. In the case where electron beams are used, one case of particular interest is where the electron beam being modulated is also the electron beam that provides the radiation to the PPP to define the modulation pattern. This amounts to self-phase modulation of the electron beam in the PPP. FIG. 8 schematically shows an example of electron beam self-phase modulation in a PPP. Here 802 is the PPP and 804 is the incident electron beam where the lengths of the arrows schematically show non-uniform beam intensity in the beam cross-section. The resulting self-phase modulation is schematically shown by 806, where the arrows are offset from each other in a way that depends on the input electron beam intensity.

Figure 9:
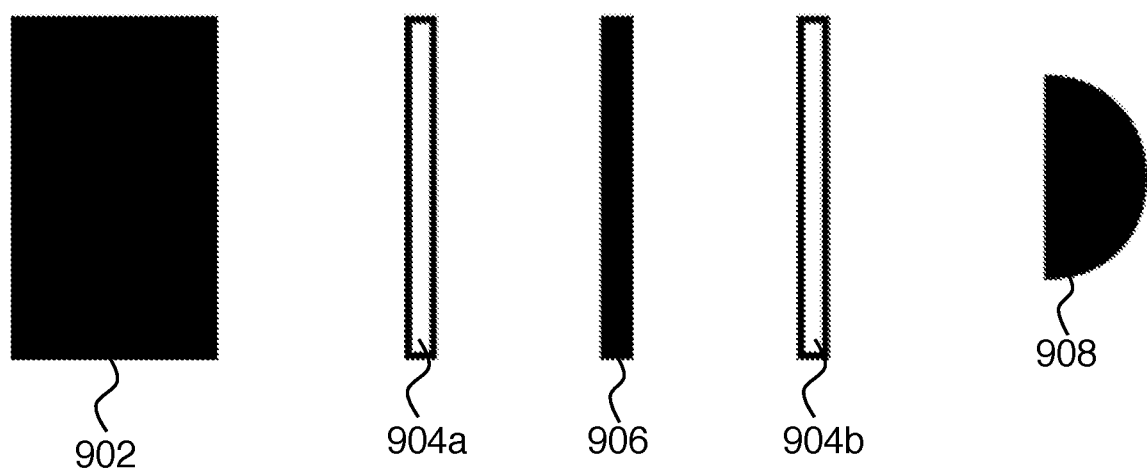
FIG. 9 schematically shows use of a PPP in a single pixel electron microscope.

FIG. 9 schematically shows use of a PPP in a single pixel electron microscope. Here 902 is the electron illumination source, 904*a,b* is the PPP which can be placed before or after sample 906, and 908 is the bucket (single-pixel) detector.

In operation, the single pixel electron microscope can capture images using a bucket detector 908 and a programmable binary mask provided by PPP 904*a* or 904*b*. Such a single pixel electron microscope (SPEM) could be built using a PPP driven by a digital micro-mirror device (DMD) to implement a binary blanker. Here electron phase modulation is converted to electron amplitude modulation by using a second PPP (not shown) and/or by configuring the electron optics (also not shown) to convert phase modulation to amplitude modulation. A SPEM would use a far less expensive detector and potentially simpler electron optics than a standard electron microscope and could also use compressive sensing algorithms to dramatically increase the efficiency of the exposures (making it possible to image more delicate samples and decreasing acquisition time).

The invention claimed is:

1. Apparatus for providing patterned phase modulation of an electron beam, the apparatus comprising:
   a planar radiation-sensitive device configured to interact with an electron beam;
   a radiation source configured to provide a pattern of incident radiation to the planar radiation-sensitive device;
   electron optics configured to provide the electron beam to the planar radiation-sensitive device;
   wherein the planar radiation-sensitive device provides a pattern of electric potential in response to the pattern of incident radiation;
   wherein interaction of the planar radiation-sensitive device with the electron beam provides a patterned phase modulation of the electron beam corresponding to the pattern of electric potential.

2. The apparatus of claim 1, wherein the planar radiation-sensitive device interacts with the electron beam by transmission of the electron beam through the planar radiation-sensitive device.

3. The apparatus of claim 1, wherein the planar radiation-sensitive device interacts with the electron beam by reflection of the electron beam from the planar radiation-sensitive device.

4. The apparatus of claim 1, wherein the planar radiation-sensitive device is selected from the group consisting of: photoelectric devices, photothermal devices, pyroelectric devices, photodissociation devices, photovoltaic devices photochemical devices, and plasmonic devices.

5. The apparatus of claim 1, wherein the planar radiation-sensitive device is a photovoltaic device selected from the group consisting of: PN diodes, PIN diodes and Schottky diodes.

6. The apparatus of claim 1, wherein the planar radiation-sensitive device includes a passive pixelation pattern, whereby lateral crosstalk in the pattern of electric potential is reduced.

7. An electron microscope including at least one electron beam phase modulator, wherein the at least one electron beam phase modulator is an apparatus according to claim 1.

8. The electron microscope of claim 7, wherein the at least one electron beam phase modulator provides one or more functions selected from the group consisting of: amplitude shaping, phase shaping, aberration correction, and phase contrast.

9. The electron microscope of claim 7, wherein the at least one electron beam phase modulator is configured to provide a single pixel electron microscope.

10. The apparatus of claim 1, further comprising a voltage source configured to provide an electrical bias to the planar radiation-sensitive device.

11. The apparatus of claim 10, wherein the electrical bias is pulsed.

12. The apparatus of claim 11, wherein the planar radiation-sensitive device is a photodiode, wherein the pattern of incident radiation is pulsed, and wherein the pulsed electrical bias reverse biases the photodiode synchronously with the pattern of incident radiation.

13. The apparatus of claim 1, wherein the pattern of incident radiation is a pattern of incident light.

14. The apparatus of claim 1, wherein the pattern of incident radiation is a pattern of incident electrons.

15. The apparatus of claim 14, wherein the pattern of incident electrons is a pattern of the electron beam, whereby self-phase modulation of the electron beam is provided.

* * * * *